(12) United States Patent
Mueller et al.

(10) Patent No.: US 10,120,970 B2
(45) Date of Patent: Nov. 6, 2018

(54) GLOBAL ROUTING FRAMEWORK OF INTEGRATED CIRCUIT BASED ON LOCALIZED ROUTING OPTIMIZATION

(71) Applicant: INTERNATIONAL BUSINESS MACHINES CORPORATION, Armonk, NY (US)

(72) Inventors: Dirk Mueller, Bornheim (DE); Sven Peyer, Boeblingen (DE); Sourav Saha, Kolkata (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/181,970

(22) Filed: Jun. 14, 2016

(65) Prior Publication Data
US 2017/0357744 A1    Dec. 14, 2017

(51) Int. Cl.
*G06F 17/50* (2006.01)

(52) U.S. Cl.
CPC ................ *G06F 17/5077* (2013.01)

(58) Field of Classification Search
CPC .................................. G06F 17/5077
USPC .................................. 716/126, 129
See application file for complete search history.

(56) References Cited

U.S. PATENT DOCUMENTS

| | | | | |
|---|---|---|---|---|
| 5,485,396 A * | 1/1996 | Brasen | ................ | G06F 17/5077 716/123 |
| 7,784,010 B1 | 8/2010 | Balsdon et al. | | |
| 8,095,903 B2 | 1/2012 | Birch et al. | | |
| 8,332,805 B1 | 12/2012 | Birch et al. | | |
| 8,407,650 B1 | 3/2013 | Avidan et al. | | |
| 8,443,325 B1 | 5/2013 | Betz et al. | | |
| 8,549,459 B1 | 10/2013 | Wadland et al. | | |
| 8,938,702 B1 | 1/2015 | Hogan et al. | | |
| 8,966,415 B2 | 2/2015 | McElvain et al. | | |
| 2009/0254875 A1* | 10/2009 | Mehrotra | ............ | G06F 17/5077 716/126 |
| 2010/0023913 A1* | 1/2010 | Cohn | .................. | G06F 17/5077 716/129 |
| 2011/0113399 A1 | 5/2011 | Vujkovic et al. | | |
| 2011/0246955 A1* | 10/2011 | Ohtsuka | .............. | G06F 17/5077 716/112 |

(Continued)

OTHER PUBLICATIONS

Cong et al., "Towards Layout-Friendly High-Level Synthesis," Proc. Int. Symp. Phys. Design, 2012, pp. 165-172.

(Continued)

*Primary Examiner* — Stacy Whitmore
(74) *Attorney, Agent, or Firm* — Cantor Colburn LLP; Margaret A. McNamara

(57) ABSTRACT

The present disclosure relates to methods, processing systems and computer program products of global routing of integrated circuits based on localized routing optimization. In certain embodiments, the method may include one or more of: defining one or more regions, one or more netgroups, and combinations thereof of an integrated circuit, associating at least one optimization objective with each region and/or each netgroup defined, generating one or more constraints for each region and/or each netgroup based on the associated optimization objectives, and performing global routing of the integrated circuit according to the one or more constraints.

14 Claims, 4 Drawing Sheets

(56) References Cited

U.S. PATENT DOCUMENTS

| | | | |
|---|---|---|---|
| 2013/0047130 A1* | 2/2013 | Daellenbach | G06F 17/5077 716/113 |
| 2013/0219353 A1* | 8/2013 | Henrickson | G06F 17/5077 716/122 |
| 2014/0189617 A1* | 7/2014 | Rashingkar | G06F 17/5077 716/102 |
| 2014/0258963 A1 | 9/2014 | Ang et al. | |

OTHER PUBLICATIONS

Mueller et al., "Faster Min-Max Resource Sharing in Theory and Practice," in Mathematical Programming Computation, Springer, 2011, pp. 1-29.

Mueller, et al. "Optimizing Yield in Global Routing." In Procof ICCAD. 2006, pp. 480-486.

* cited by examiner

GLOBAL ROUTING FRAMEWORK OF INTEGRATED CIRCUIT BASED ON LOCALIZED ROUTING OPTIMIZATION

BACKGROUND

The present disclosure relates to integrated circuit design, and more specifically, to routing systems, methods and a computer program product for performing global routing of integrated circuits based on localized routing optimization.

With designs growing in size and becoming complex in system-on-a-chip (SOC)/Microprocessor designs, a quick and efficient design construction framework requires many localized optimization support. Different parts of integrated circuit chip design have different challenges to be addressed, which in turn requires CAD tools to be configured differently as per varying design optimization objectives. The challenges may include timing, power, routability, congestion, crosstalk, and yield. Currently, efforts have been made to synthesis optimization and placement optimization. It is desirable to extend the optimization to global routing.

Therefore, heretofore unaddressed needs still exist in the art to address the aforementioned deficiencies and inadequacies.

SUMMARY

In one aspect, the present disclosure relates to a method of global routing of integrated circuits based on localized routing optimization. In certain embodiments, the method may include one or more of: defining one or more regions, one or more netgroups, and combinations thereof of an integrated circuit, associating at least one optimization objective with each region and/or each netgroup defined, generating one or more constraints for each region and/or each netgroup based on the associated optimization objectives, and performing global routing of the integrated circuit according to the one or more constraints.

In another aspect, the present disclosure relates to a processing system for performing global routing of integrated circuits based on localized routing optimization. In certain embodiments, the processing system may include a processor configured to perform global and detailed routing of an integrated circuit, a graphical user interface configured to display layout of the integrated circuit and allow a user to perform global and detail routing manually, and a memory storing computer executable instructions having at least an integrated circuit processing module and a global and detailed routing module. When executed by the processor of the processing system, the computer executable instructions cause the processor to perform: defining one or more regions, one or more netgroups, and combinations thereof of an integrated circuit, associating at least one optimization objective with each region and/or each netgroup defined, generating one or more constraints for each region and/or each netgroup based on the associated optimization objectives, and performing global routing of the integrated circuit according to the one or more constraints.

In yet another aspect, the present disclosure relates to a computer program product. In certain embodiments, the computer program product may include a non-transitory storage medium readable by a processor. The non-transitory storage medium may store computer executable instructions for execution by the processor to perform a method of global routing of integrated circuits based on localized routing optimization. In certain embodiments, the method may include: defining one or more regions, one or more netgroups, and combinations thereof of an integrated circuit, associating at least one optimization objective with each region and/or each netgroup defined, generating one or more constraints for each region and/or each netgroup based on the associated optimization objectives, and performing global routing of the integrated circuit according to the one or more constraints.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
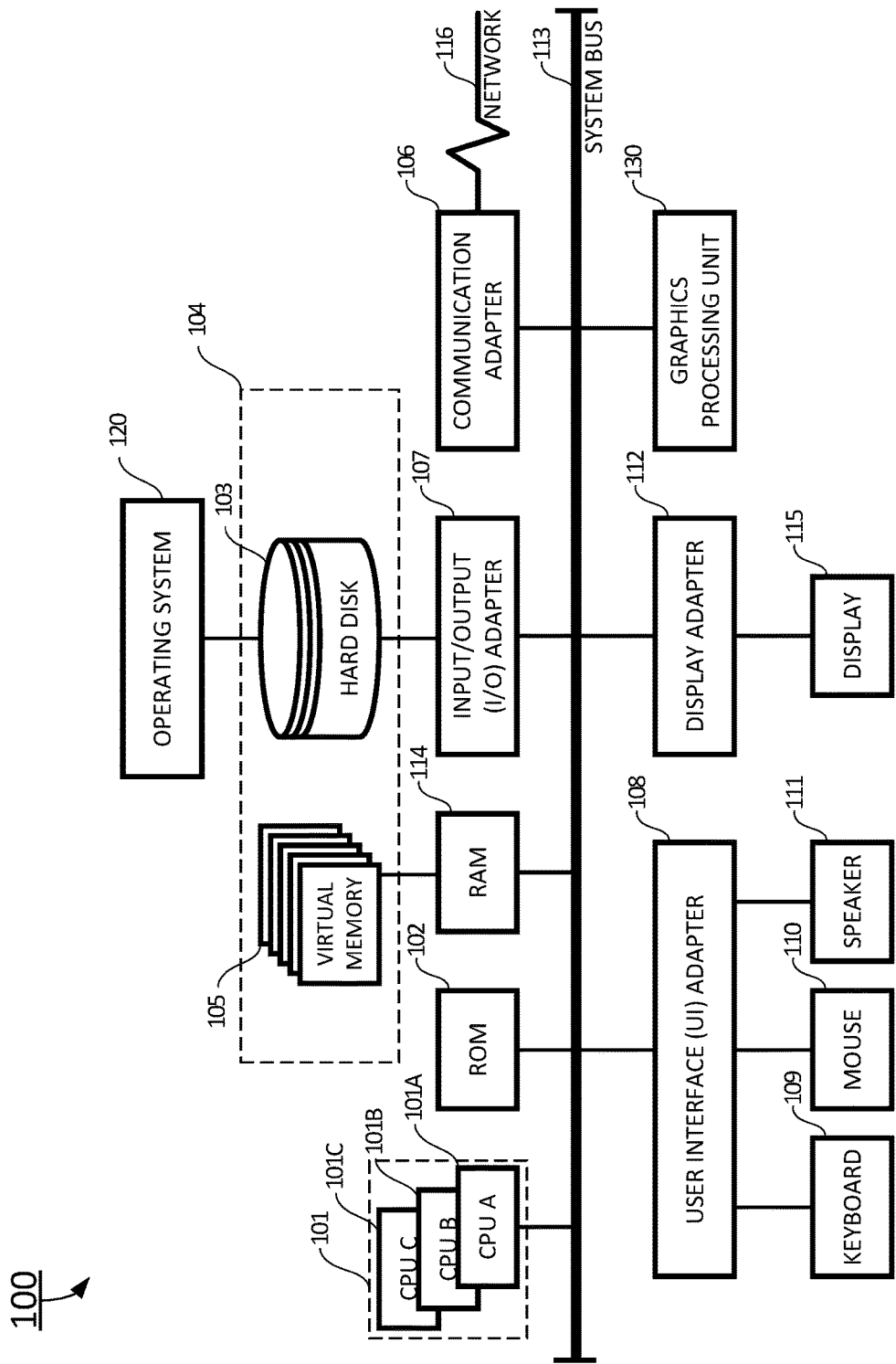
FIG. 1 is a block diagram illustrating an exemplary computer system for performing global routing of integrated circuits based on localized routing optimization according to certain embodiments of the present disclosure.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term computer program, as used above, may include software, firmware, and/or microcode, and may refer to programs, routines, functions, classes, and/or objects. The term shared, as used above, means that some or all code from multiple modules may be executed using a single (shared) processor.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-4, in which certain exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

Referring to FIG. 1, an embodiment of a computer system 100 for performing global routing of integrated circuits based on localized routing optimization and implementing the teachings herein. In this embodiment, the computer system 100 has one or more central processing units (processors) 101A, 101B, 101C, etc. (collectively or generically referred to as processor(s) 101). In one embodiment, each processor 101 may include a reduced instruction set computer (RISC) microprocessor. Processors 101 are coupled to a system memory 114 and various other components via a system bus 113. Read only memory (ROM) 102 is coupled to the system bus 113 and may include a basic input/output system (BIOS), which controls certain basic functions of the computer system 100.

FIG. 1 further depicts an input/output (I/O) adapter 107 and a communication adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and virtual memory device 105 are collectively referred to herein as mass storage 104. An operating system 120 for execution on the computer system 100 may be stored in mass storage 104. The communication adapter 106 interconnects bus 113 with an outside network 116 enabling the computer system 100 to communicate with other such systems. A screen (e.g., a display monitor) 115 is connected to system bus 113 by a display adaptor 112, which may include a graphics adapter to improve the performance of graphics intensive applications and a video controller. In one embodiment, the I/O adapters 107, the communication adapter 106, and the display adapter 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and the display adapter 112. A keyboard 109, a mouse 110, and one or more speakers 111 all interconnected to bus 113 via user interface adapter 108, which may include, for example, a Super I/O chip integrating multiple device adapters into a single integrated circuit.

In exemplary embodiments, the computer system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing and has a highly parallel structure that makes it more effective than general-purpose CPUs for algorithms where processing of large blocks of data is done in parallel.

Thus, as configured in FIG. 1, the computer system 100 includes processing capability in the form of processors 101, storage capability including the system memory 114 and mass storage 104, input means such as the keyboard 109 and the mouse 110, and the output capability including the one or more speakers 111 and display 115. In one embodiment, a portion of the system memory 114 and mass storage 104 collectively store the operating system 120 to coordinate the functions of the various components shown in FIG. 1. In certain embodiments, the network 116 may include symmetric multiprocessing (SMP) bus, a Peripheral Component Interconnect (PCI) bus, local area network (LAN), wide area network (WAN), telecommunication network, wireless communication network, and the Internet.

Figure 2:
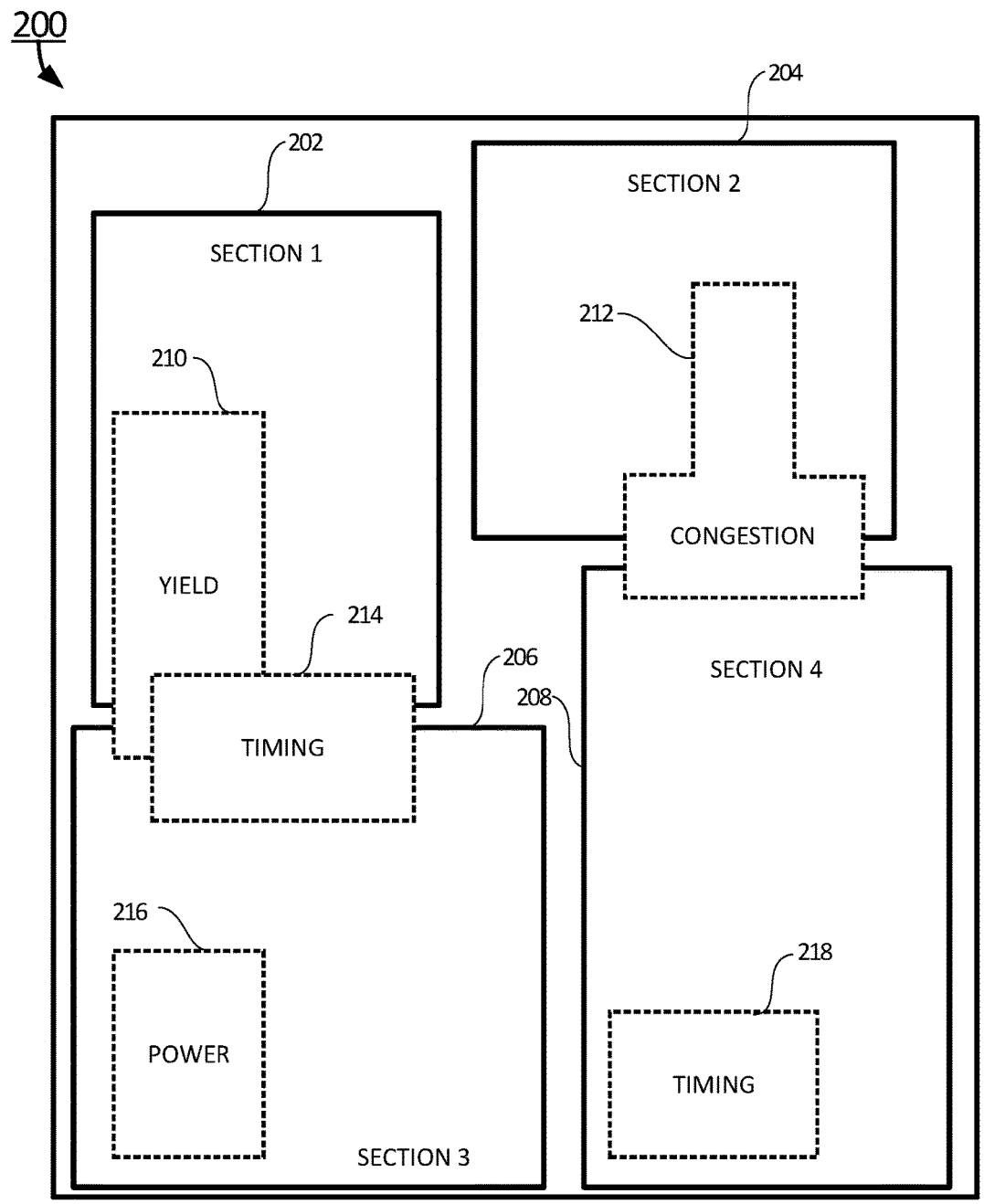
FIG. 2 is a block diagram showing different regions with their associated optimization objectives of an exemplary integrated circuit according to certain embodiments of the disclosure.

Referring now to FIG. 2, a block diagram showing different regions of an exemplary integrated circuit 200 is shown according to certain embodiments of the present disclosure. The integrated circuit 200 may include one or more sections: SECTION 1 (202), SECTION 2 (204), SECTION 3 (206) and SECTION 4 (208). In certain embodiments, each of the one or more sections 202, 204, 206 and 208 may be disjoined.

Different regions of an integrated circuit design have different challenges to be addressed which in turn require computer aided design (CAD) tools to be configured differently as per varying design optimization objectives. Currently, the optimization objectives have been addressed in synthesis and placement stage of the integrated circuit design, and it is desirable to address the optimization objective in global and detailed routing stage of the integrated circuit design. In certain embodiments, most common routing objectives may include net length, congestion, noise, resistor/capacitor (RC) delay, power, yield, and timing. The net length routing objective may require the chip area to have minimum wiring length. The noise routing objective may require the chip area to limit number of noise-critical nets per region for better spacing. The power routing objective may require the chip area to have minimum capacitance. The yield routing objective may require the chip area to minimize critical areas.

In certain embodiments, routing may be configured (constrained) in many ways, such like layer assignments, wiretype (width+space), priorities, scenic ratios, and RC budgets. Each routing objective will have pre-assigned values for supported routing parameters and constraints.

In certain embodiments, global routing and detailed routing of the integrated circuit is performed using a resource sharing algorithm (RSA). Each routing objective is a constraint in the resource sharing algorithm. Each segment of a net may consume a certain resource, which may depend on the objective to be optimized. For example, the net length routing objective may affect length budget of resource in local area. The noise routing objective may affect routing space of the resource in local area. The yield routing objective may affect critical area resource in local area. The power routing objective may affect total capacitances of the resource at a driver level, and the RC delay routing objective may affect RC budget of the resource at a driver level. Currently, today's global routing solution can only optimize one objective on the entire chip area at a time. The resource sharing algorithm has been used with the same objective for all nets on the entire chip. In certain embodiments, the present disclosure presents a global routing solution by dividing the entire chip area into one or more regions and performing global routing using the resource sharing algorithm in a fine-grained manner with each of the one or more regions having its own, independent local routing objectives.

In certain embodiments, the one or more sections of the integrated circuit 200 may be divided into one or more regions: REGION 1 (210), REGION 2 (212), REGION 3 (214), REGION 4 (216), and REGION 5 (218). In other embodiments, the one or more sections of the integrated circuit 200 may be divided into one or more netgroups (NGs): NG1, NG2, NG3, and NG4 (not shown in FIG. 2). Each region and/or each netgroup may be associated with at least one optimization objective, so that each region and/or each netgroup may be routed according to the corresponding optimization objective associated. A few exemplary optimization objectives may include "YIELD" in REGION 1 (210), "CONGESTION" in REGION 2 (212), "TIMING" in REGION 3 (214), "POWER" in REGION 4 (216) and "TIMING" in REGION 5 (218). In certain embodiments, the one or more regions may be disjoined: such as REGION 2 (212), REGION 4 (216), and REGION 5 (218). In other embodiments, certain regions may be overlapped: such as REGION 1 (210), and REGION 3 (214). Netgroups in the integrated circuit 200 are processed in a similar way with the regions, and will be discussed in detail here.

These routing optimization objectives are mainly addressed in the global routing stage. Once the global routing stage is completed, detailed routing may be performed to embed wires according to completed global routing solution.

Figure 3:
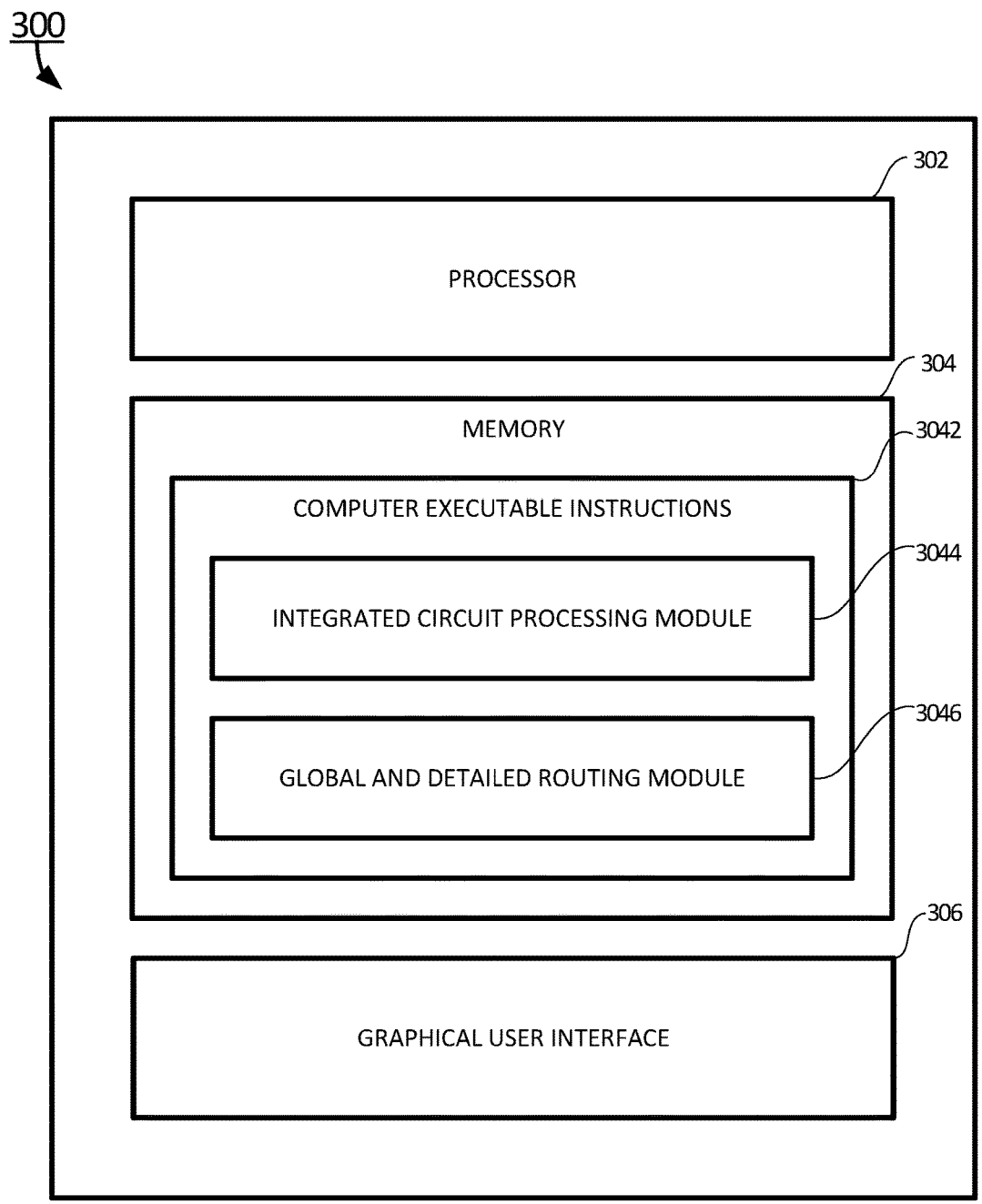
FIG. 3 is a block diagram of an exemplary processing system according to certain embodiments of the disclosure.

In one aspect, the present disclosure relates to a processing system 300 for global routing of integrated circuits based on localized routing optimization as shown in FIG. 3. In certain embodiments, the processing system may include a processor 302 configured to perform global and detailed routing of an integrated circuit, a graphical user interface 306 configured to display layout of the integrated circuit and allow a user to perform global and detail routing manually, and a memory 304 storing computer executable instructions 3042 having at least an integrated circuit processing module 3044 and a global and detailed routing module 3046. When executed at the processor of the processing system 300, the computer executable instructions cause the processor 302 to perform: defining one or more regions and/or one or more groups of an integrated circuit by the integrated circuit processing module 3044, associating at least one optimization objective with each of the one or more regions by the integrated circuit processing module 3044, generating one or more constraints based on the associated optimization objectives by the integrated circuit processing module 3044, and performing global and detailed routing of the integrated circuit according to the one or more associated constraints by the global and detailed routing module 3046.

In certain embodiments, the generating may include adding corresponding optimization objectives in a region to a corresponding constraint when solution space for nets contains a route that at least one segment is in the corresponding region.

In certain embodiments, the associated optimization objective for a region may apply to the entire region. The associated optimization objective for a region may apply to a net in a region when at least one part of the net is effective in the region.

In certain embodiments, the performing may include: performing a global routing of each of one or more segments of a net of the integrated circuit when the global routing is performed in accordance with the optimization objective and the constraints of the regions.

In certain embodiments, the performing may include: performing a global routing using a revised resource sharing algorithm (RSA). The revised resource sharing algorithm (RSA) may include performing the global routing when one or more segments of a net contribute to the optimization objective in the region.

In certain embodiments, the graphical user interface 306 may be used by a user to see a process of integrated circuit global and/or detailed routing. On other embodiments, the user may use the graphical user interface 306 to manually change certain parameters, change the distributions of segments, nets, netgroups, and regions, change certain optimization objectives in different regions and/or netgroups.

In another aspect, the present disclosure relates to a computer program product. In certain embodiments, the computer program product may include a non-transitory storage medium readable by a processor. The non-transitory storage medium may store computer executable instructions for execution by the processor to perform a method of global routing of integrated circuits based on localized routing optimization. In certain embodiments, the method may include: defining one or more regions, one or more netgroups, and combinations thereof of an integrated circuit, associating at least one optimization objective with each region and/or each netgroup defined, generating one or more constraints for each region and/or each netgroup based on the associated optimization objectives, and performing global routing of the integrated circuit according to the one or more constraints.

Figure 4:
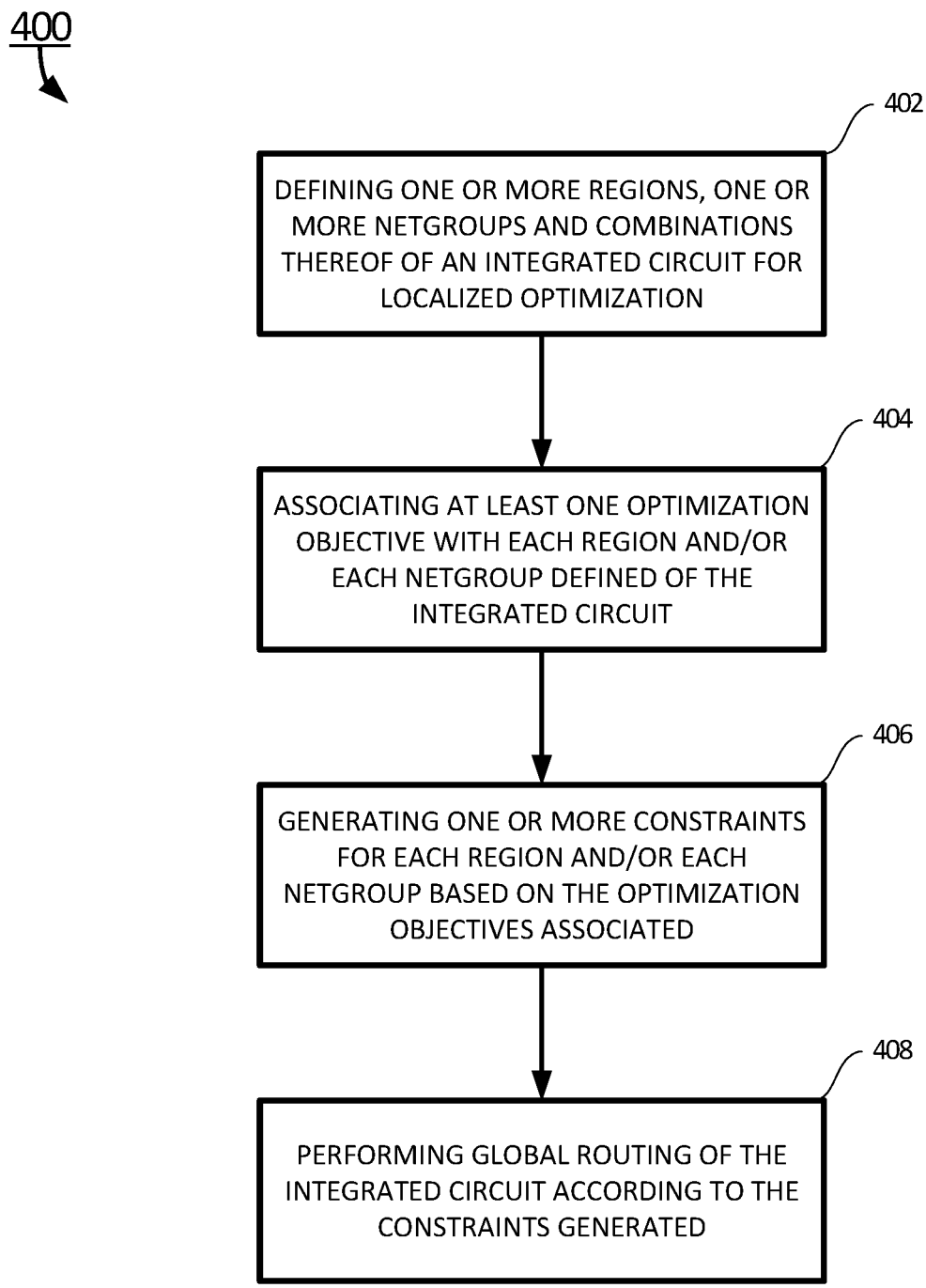
FIG. 4 is a flowchart of a method of global routing of integrated circuits based on localized routing optimization according to certain embodiments of the present disclosure.

In yet another aspect, the present disclosure relates to a method of global routing of integrated circuits based on localized routing optimization. Referring now to FIG. 4, a flowchart of a method 400 of global routing of integrated circuits based on localized routing optimization is shown according to certain embodiments of the present disclosure.

At block 402, in certain embodiments, the integrated circuit processing module 3044 of the computer executable instructions may define one or more regions on the integrated circuit according to original design of the integrated circuit. In certain embodiments, the integrated circuit processing module 3044 of the computer executable instructions may define one or more netgroups on the integrated circuit according to original design of the integrated circuit.

In one embodiment, a user may perform this operation manually through the graphical user interface 306. In other embodiments, the operation may be performed by a combination of the integrated circuit processing module 3044 and the user manually.

At block 404, in certain embodiments, the integrated circuit processing module 3044 of the computer executable instructions may associate at least one optimization objective with each region such that localized optimization is performed at a region level instead of entire chip area. In certain embodiments, the integrated circuit processing module 3044 of the computer executable instructions may associate at least one optimization objective with each netgroup such that localized optimization is performed at a netgroup level instead of entire chip area.

In certain embodiments, the associated optimization objective for a region may apply to a net in the region when at least one part of the net is effective in the region.

At block 406, in certain embodiments, the integrated circuit processing module 3044 of the computer executable instructions may generate one or more constraints for each region based on the associated optimization objective of the region. In certain embodiments, the integrated circuit processing module 3044 of the computer executable instructions may generate one or more constraints for each netgroup based on the associated optimization objective of the netgroup.

In certain embodiments, generation of the one or more constraints may include adding corresponding optimization objectives in a region to a corresponding constraints for each region when solution space for nets contains a route that at least one segment is in the corresponding net of the region.

At block 408, in certain embodiments, the global and detail routing module 3046 of the computer executable instructions may perform global routing of the integrated circuit in accordance with the one or more constraints generated on each region. In certain embodiments, the global and detail routing module 3046 of the computer executable instructions may perform global routing of the integrated circuit in accordance with the one or more constraints generated on each netgroup.

In certain embodiments, the integrated circuit processing module 3044 may include a revised resource sharing algorithm (RSA). In certain embodiments, the revised resource sharing algorithm (RSA) may include performing the global routing when one or more segments of a net contribute to the optimization objective in the region. In certain embodiments, the revised resource sharing algorithm (RSA) may include performing the global routing on nets belonging to one or more netgroups with an associated optimization objective when one or more segments of a net contribute to the optimization objective in the netgroup.

In certain embodiments, the performing may include: performing a global routing of each of one or more segments of a net of the integrated circuit when the global routing is performed in accordance with the optimization objective and the constraints of the corresponding region. In certain embodiments, the performing may include: performing a global routing of each of one or more segments of a net of the integrated circuit when the global routing is performed in accordance with the optimization objective and the constraints of the corresponding netgroup.

Aspects of the present disclosure are described herein with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of global routing of integrated circuits based on localized routing optimization, the method comprising:
    defining, using a processor, one or more regions of an integrated circuit;

assigning, using the processor, at least one optimization objective with each region defined;

generating, using the processor, one or more constraints for each region, based on the assigned optimization objectives, wherein the generating comprises:

adding corresponding optimization objectives in a region to a corresponding constraint for each of the one or more regions when solution space for nets contains a route that at least one segment is in the corresponding region; and performing, using the processor, global routing of each of one or more segments of a net of the integrated circuit according to the optimization objective and the one or more constraints of the region;

causing, by the processor, the integrated circuit to be fabricated.

2. The method of claim 1, wherein the associated optimization objective for a region applies to the entire region.

3. The method of claim 1, wherein the associated optimization objective for a region applies to a net in the region when at least one part of the net is operating in the region.

4. The method of claim 1, wherein the performing comprises:

performing a global routing using a revised resource sharing algorithm (RSA).

5. The method of claim 4, wherein the revised resource sharing algorithm (RSA) comprises performing the global routing when one or more segments of a net contribute to the optimization objective in the region.

6. A processing system for global routing of integrated circuits based on localized routing optimization comprising:

a processor configured to perform global routing of an integrated circuit;

a graphical user interface configured to display layout of the integrated circuit, and allow a user to perform global and detail routing manually; and a memory storing computer executable instructions having an integrated circuit processing module, and a global and detailed routing module, wherein when executed at the processor of the processing system, the computer executable instructions cause the processor to perform:

defining, by the integrated circuit processing module, one or more regions of an integrated circuit;

assigning, by the integrated circuit processing module, at least one optimization objective with each region defined;

generating, by the integrated circuit processing module, one or more constraints for each region based on the assigned at least one optimization objective, wherein the generating comprises:

adding corresponding optimization objectives in a region to a corresponding constraints for each of the one or more regions when solution space for nets contains a route that at least one segment is in the corresponding net of the region; and performing, by the global and detailed routing module, global and detailed routing of each of one or more segments of a net of the integrated circuit according to the optimization objective and the one or more constraints of the region;

causing, by the processor, the integrated circuit to be fabricated.

7. The processing system of claim 6, wherein the associated optimization objective for a region applies to the entire region.

8. The processing system of claim 6, wherein the associated optimization objective for a region applies to a net in a region when at least one part of the net is operating in the region.

9. The processing system of claim 6, wherein the performing comprises:

performing a global routing using a revised resource sharing algorithm (RSA).

10. The processing system of claim 9, wherein the revised resource sharing algorithm (RSA) comprises performing the global routing when one or more segments of a net contribute to the optimization objective in the region.

11. A computer program product comprising:

a non-transitory storage medium readable by a processor and storing computer executable instructions for execution by the processor to perform a method of global routing of integrated circuits based on localized routing optimization, the method comprising:

defining, using the processor, one or more regions, one or more netgroups, and combinations thereof of an integrated circuit;

associating, using the processor, at least one optimization objective with each region and/or each netgroup defined;

generating, using the processor, one or more constraints for each region and/or each netgroup based on the associated at least one optimization objective, wherein the generating comprises:

adding corresponding optimization objectives in a region to a corresponding constraints for each of the one or more regions when solution space for nets contains a route that at least one segment is in the corresponding net of the region and/or the corresponding netgroup; and performing, using the processor, global routing of each of one or more segments of a net of the integrated circuit according to the optimization objective and the one or more constraints of the region;

causing, by the processor, the integrated circuit to be fabricated.

12. The computer program product of claim 11, wherein the associated optimization objective for a region applies to the entire region.

13. The computer program product of claim 11, wherein the associated optimization objective for a region applies to a net in a region when at least one part of the net is operating in the region.

14. The computer program product of claim 11, wherein the performing comprises performing a global routing using a revised resource sharing algorithm (RSA), wherein the revised resource sharing algorithm (RSA) comprises performing the global routing when one or more segments of a net contribute to the optimization objective in the region.

* * * * *